United States Patent [19]

Tanizawa et al.

[11] Patent Number: 4,523,106

[45] Date of Patent: Jun. 11, 1985

[54] INTEGRATED CIRCUIT HAVING PREDETERMINED OUTER TO INNER CELL PITCH RATIO

[75] Inventors: Tetsu Tanizawa; Hitoshi Omichi, both of Kawasaki; Yoshiharu Mitono, Tokyo, all of Japan

[73] Assignee: Fujitsu Limited, Kawasaki, Japan

[21] Appl. No.: 411,269

[22] Filed: Aug. 25, 1982

[51] Int. Cl.³ .................. H03K 3/26; H03K 1/00; H01J 37/28

[52] U.S. Cl. .................. 307/303; 307/279; 174/68.5; 364/490; 357/45

[58] Field of Search .............. 307/303, 279; 174/68.5; 357/45; 364/491; 361/403, 410, 416

[56] References Cited

U.S. PATENT DOCUMENTS

| | | | |
|---|---|---|---|
| 4,225,672 | 3/1981 | Ohno et al. | 357/45 |
| 4,377,849 | 3/1983 | Finger | 364/491 |
| 4,458,297 | 7/1984 | Stopper | 174/68.5 |

Primary Examiner—Stanley D. Miller
Assistant Examiner—B. P. Davis
Attorney, Agent, or Firm—Staas & Halsey

[57] ABSTRACT

An integrated circuit device such as a gate array or a master slice LSI device which is formed on a semiconductor chip and which comprises an inner cell array including a plurality of inner cells, an outer cell array including a plurality of outer cells formed around the inner cell array, a power supply portion having one or more outer power supply lines, and a plurality of inner power supply lines connected to the outer power supply lines and formed on the inner cell array. The ratio of the pitch length of the outer cells to the pitch length of the inner power supply lines or the inner cells is determined by the ratio of two integers. In the integrated circuit device, at least one set of an outer cell, and an inner cell which are arranged in a predetermined positional relation, is formed a plurality of times along a side of the semiconductor chip.

8 Claims, 2 Drawing Figures

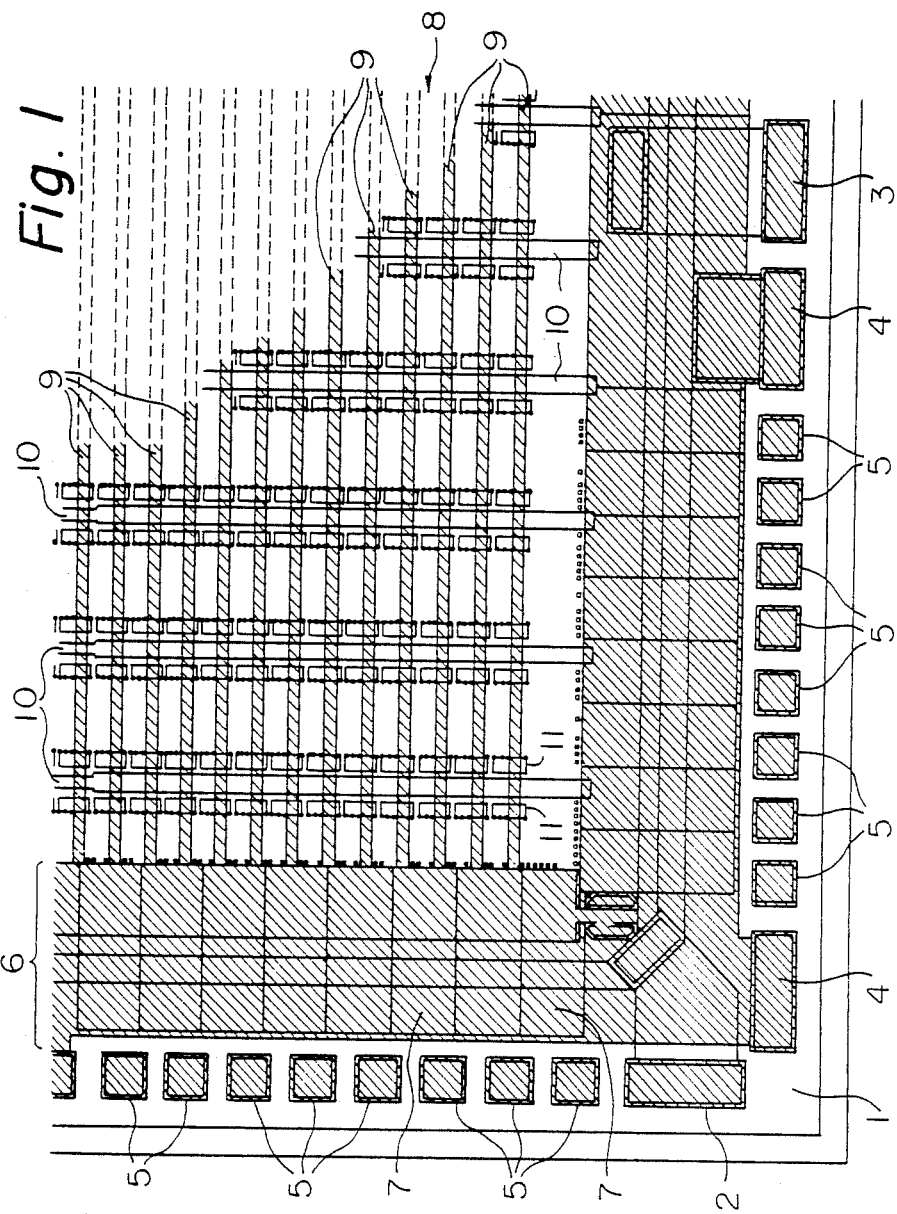

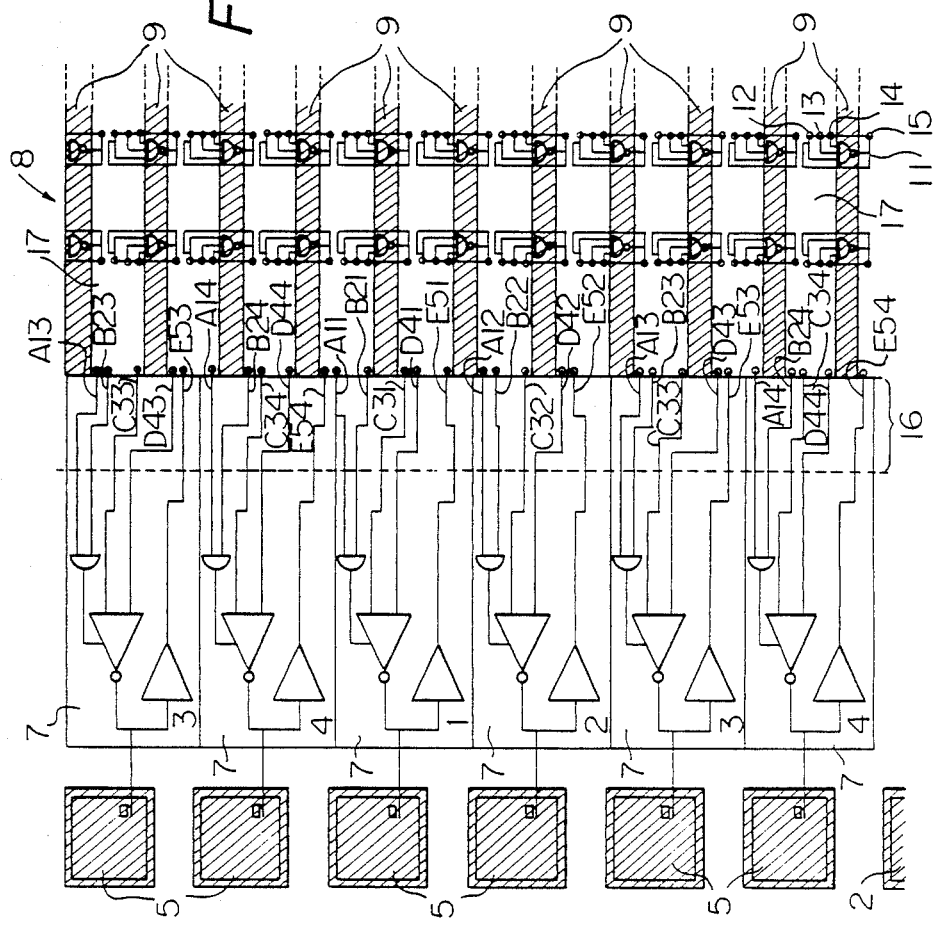

INTEGRATED CIRCUIT HAVING PREDETERMINED OUTER TO INNER CELL PITCH RATIO

BACKGROUND OF THE INVENTION (1) Field of the Invention

The present invention relates to an integrated circuit (IC) device. More particularly, it relates to an IC device such as a gate array IC device in which circuit patterns connecting the outer cells and inner cells are simplified.

(2) Description of the Prior Art

In general, an IC device such as a gate array IC device comprises an inner cell array having a plurality of inner cells, i.e., basic cells; an outer cell array having a plurality of outer cells; inner power supply lines; and outer power supply lines. The outer cell array and the outer power supply lines are formed around the inner cell array. Each of the inner cells includes inner circuits of the IC device, such as gate circuits and flip-flop circuits. Each of the outer cells has one or more input/output buffer circuits. From the outer power supply lines, a plurality of inner power supply lines extend toward and onto the inner cell array.

In a conventional IC device, the outer cells and the inner cells are arranged regularly, i.e., at constant pitches, on the semiconductor chip in order to simplify the design automation (DA) process and so on. However, no consideration is given to the relation between the pitch length of the outer cells and the pitch length of the inner cells. The pitch length of the outer cells is adjusted to the pitch length of the bonding pads of the IC device, while the pitch length of the inner cells is determined by the size, number, and connecting patterns of the inner circuits and so on. In other words, the pitch lengths of the outer cells and the inner cells are determined independently from each other.

Therefore, in the conventional IC device, the circuit patterns connecting the basic cells and the outer cells, and the positions of the connecting terminals of the cells, differ from each other for every basic cell and for every outer cell.

Moreover, since the inner power supply lines are usually formed on the inner cell array including the inner cells and parts of the area of the inner cell array are covered with the inner power supply lines, the positions of the connecting patterns of the inner cells are limited, although the inner power supply lines are disposed at a pitch length equal to or several times the pitch length of the inner cells. For this reason and along with the aforementioned disadvantages, the circuit patterns of the conventional IC device are complicated and design thereof is difficult.

Generally, a master slice type IC device comprises electronic parts such as transistors formed at predetermined positions on a semiconductor chip. Parts of the circuit patterns connecting the electronic parts, gate circuits, flip-flop circuits, and so on, are previously formed. In the DA process, information of several kinds of circuit patterns connecting the electronic parts is stored in a library file of a computer system. Information of selected circuit patterns from the library file is input to a connecting pattern forming means, whereby the desired circuit patterns are formed on the semiconductor chip. In such a process, it is preferable that connections between the inner cells and the outer cells are effected by using a smaller number of connecting patterns. However, in the above-mentioned conventional IC device, since the pitch lengths of the outer cells and the inner cells are different and independent, there are as many versions of the connecting patterns as there are outer cells or input/output buffers. This complicates the overall circuit pattern of the IC device. That is, in the conventional IC device, it is necessary to prepare the different connecting patterns connecting the input/output buffers and the basic cells. This makes it difficult to simplify the circuit pattern of the IC device. The large number of pattern versions complicates the process of design automation and increases the required capacity of the library files storing the connecting patterns.

SUMMARY OF THE INVENTION

It is, therefore, an object of the present invention to reduce the number of different circuit patterns connecting the outer cells and inner cells of an IC device, thereby simplifying the overall circuit pattern of the IC device.

It is a second object of the present invention to reduce the required memory capacity of the library file storing the pattern data of the circuit patterns connecting the outer cells and the inner cells and used in a design automation system for automatically effecting design of the circuit patterns.

It is a third object of the present invention to simplify the process of designing circuit patterns in the design automation system.

It is a fourth object of the present invention to improve the reliability in the design automation process and to improve the reliability of an IC device.

According to the present invention, there is provided an IC device which is formed on a semiconductor chip and which comprises an inner cell array including a plurality of inner cells, an outer cell array including a plurality of outer cells formed around the inner cell array, a power supply portion having one or more outer power supply lines, and a plurality of inner power supply lines connected to the outer power supply lines and formed on the inner cell array, characterized in that a pitch length $P_E$ of the outer cells and a pitch length $P_I$ of the inner cells have the following relation:

$$mP_E = nP_I$$

where m and n are positive integers, wherein sets of an outer cell and an inner cell which are arranged in a predetermined positional relation to each other are formed a plurality of times along a side of the semiconductor chip.

BRIEF DESCRIPTION OF THE DRAWINGS

FIG. 1 is a partial schematic view of an IC device according to the present invention; and FIG. 2 is an enlarged detailed view of a part of the IC device of FIG. 1.

DESCRIPTION OF THE PREFERRED EMBODIMENT

An embodiment of the present invention is now explained with reference to the attached drawings.

FIG. 1 is a part of an IC device according to the present invention. In FIG. 1, reference numeral 1 designates a semiconductor chip on which the IC device is formed. Reference numerals 2 and 3 are bonding pads for the power source. Reference numerals 4 designate bonding pads for ground, and reference numerals 5 designate bonding pads for signal lines. Along the bonding pads 2, 3, 4, and 5 and between the bonding pads 2, 3, 4, and 5 and an inner cell array 8, there is formed a power supply portion 6 which comprises outer power supply lines connected to the bonding pads 2 and 3 for the power source and the bonding pads 4 for ground. This power supply portion is schematically shown by hatched areas. Under the power supply portion 6 a plurality of outer cells 7 are formed, which are illustrated in detail in FIG. 2, each of which is connected to a predetermined inner cell, i.e., a basic cell in the inner cell array 8. The connections between the outer cells 7 and the basic cells in the inner cell array 8 are automatically designed by the DA process. Reference numerals 9 and 10 designate inner power supply lines which extend from the outer power supply lines of the power supply portion 6 in the horizontal and vertical directions, respectively. The inner power supply lines 9 and 10 are arranged for every inner cell. Therefore, the positions of the inner power supply lines 9 and 10 are determined by the positions of the inner cells. In FIG. 1, one of the inner cells of the inner cell array 8 is designated by a reference numeral 11.

FIG. 2 is a part of the IC device in detail. In FIG. 2, the same parts as appearing in FIG. 1 are designated by the same reference numerals. Reference numerals 12, 13, 14, and 15 in one of the inner cells 11 designate contact terminals, i.e., contact holes. The other inner cells, whose reference numerals are omitted for the sake of simplicity, include the same contact terminals. In FIG. 2, reference symbols A11, B21, C31, D41, E51; A12, B22, C32, D42, E52; A13, B23, C33, D43, E53; and A14, B24, C34, D44, E54 designate interface patterns used for connecting the inner cells of the inner cell array 8 to the outer cells 7 of the outer cell array. Each of the groups of the interface patterns included between the semicolons is disposed at a predetermined pitch length, i.e., a pitch length of the outer cells.

Each of the outer cells 7 comprises an input/output buffer circuit and each has the same circuit pattern. In FIG. 2, illustration of the power supply portion 6 including the outer power supply lines formed on the outer cells 7 and on an interface pattern portion 16 is omitted for the sake of simplicity.

The interface patterns A11, B21, C31, . . . of the outer cell array 8 are included in the interface pattern portion 16, as illustrated in FIG. 2. The areas 17, which are outside the inner cells 11 and the inner power supply lines 9, are automatic wiring areas whose circuit patterns are automatically designed by the DA process. Therefore, it is necessary to dispose the contact through holes within the automatic wiring areas 17. This is because the circuit patterns which connect the inner cells 11 and the outer cells 7 and which are not shown in FIG. 2 are formed in the same layer as the inner power supply lines 9 formed on the inner cells 11.

In the IC device according to the present invention, the pitch length $P_E$ of the outer cells 7 and the pitch length $P_I$ of the inner cells 11 or of the inner power supply lines 9 have the following relation.

$$mP_E = nP_I \quad (1)$$

Where, m is the number of pattern versions of the outer cells 7, including the interface patterns of the interface pattern portion 16, and m and n are positive integers. The number m is smaller than the number of the outer cells 7 disposed along a side of the IC chip. In the IC device satisfying formula (1), the number of kinds of interface patterns in the interface pattern portion 16 is only m.

In the embodiment of FIG. 2, four outer cells correspond to seven inner cells. That is, $4P_E = 7P_I$ (m=4, n=7). Therefore, the number of kinds of interface patterns of the interface pattern portion 16 connecting the outer cells 7 and the inner cells 11 is four. In other words, there are four pattern versions of the interface patterns. As is apparent from FIG. 2, the same interface pattern repeats every four pitches.

It is preferable that the number m be equal to or smaller than L/2, where L is the number of the outer cells 7 disposed along one side of the IC chip. In a conventional IC device, since the pitch length of the inner cells and the pitch length of the outer cells are independently determined and have no relation to each other, all the interface patterns of the interface pattern portion are different. On the other hand, in the IC device according to the present invention, if the above-mentioned relation, i.e., m is equal to or smaller than L/2, is satisfied, each of the same interface patterns in the interface pattern portion 16 is used at least twice on one side of the IC chip. The repetitive use of the interface patterns and the relatively small number of resultant interface patterns enables the reduction of the area of the library file for storing the pattern information of the interface patterns and enables simplification of the DA process for determining the circuit patterns. This simplifies the manual operation of preparing all kinds of interface patterns and inputting them into the pattern library and improves the reliability of the design process of the IC device. It is also possible to define m macro cells each of which includes an outer cell and an interface pattern of the outer cell. In this case, since the pitch lengths of the outer cells 7 and the inner cells 11 of the inner cell array 8 have the relation shown by the formula (1), the number of such macro cells or other optional patterns is very small.

In conclusion, the advantages of the present invention are as follows:

(1) Since the pitch lengths of the outer cells and the inner cells, i.e., the inner power supply lines, have the relation shown by the formula (1), the number of interface patterns connecting the outer cells and the inner cells can be greatly reduced.

(2) The number of tables storing the pattern information of the interface patterns can be decreased and the program for determining the circuit patterns of an IC device in the DA process can be simplified, resulting in improved reliability in the design process of and IC device.

(3) It is possible to define macro cells of a small number m, resulting in a simplified design process for the IC device.

We claim:

1. An integrated circuit device formed on a semiconductor chip having sides, comprising:
an inner cell array having at least one side, formed on the semiconductor chip, including a plurality of inner cells having a pitch length $P_I$;
an outer cell array formed between said at least one side of said inner cell array and one of the sides of the semiconductor chip, including a plurality of outer cells having a pitch length $P_E$ and patterns, and formed such that corresponding sets of said outer cells and said inner cells are arranged in predetermined positions a plurality of times along said one of the sides of the semiconductor chip, and wherein the pitch length of said outer cells and inner cells is related by the formula $mP_E=nP_I$, where m and n are positive integers;

a power supply portion, formed on said outer cell array between said one of the sides of the semiconductor chip and said at least one side of said inner cell array, having one or more outer power supply lines; and a plurality of inner power supply lines operatively connected to said outer power supply lines and formed on said inner cell array.

2. An integrated circuit device according to claim 1, wherein said number m is equal to or smaller than L/2, where L is the number of said outer cells disposed along a side of the semiconductor chip.

3. An integrated circuit device according to claim 1 or 2, wherein said inner power supply lines are disposed in a one-to-one correspondence with said inner cells.

4. An integrated circuit device according to claim 1, wherein said outer cells and inner cells are connected by an interface pattern portion which comprises m kinds of interface patterns.

5. An integrated circuit device according to claim 4, wherein each of said interface patterns is integrally formed with one of said outer cells to form a macro cell.

6. An integrated circuit device according to claim 1 or 2, operatively connected to receive signals, further comprising bonding pads, each bonding pad having a pitch length, for receiving signals, wherein said outer cells are arranged along at least one side of the semiconductor chip at the pitch length $P_E$ substantially equal to the pitch length of said bonding pads.

7. An integrated circuit device according to claim 1 or 2, further comprising an interface pattern portion for connecting said outer cells and said inner cells, wherein said power supply portion is formed on the interface pattern portion and connects said outer cells and said inner cells.

8. An integrated circuit device formed on a semiconductor chip having first through fourth sides, comprising:

an inner cell array, formed on the semiconductor chip, having first through fourth sides corresponding to the first through fourth sides of the semiconductor chip, including a plurality of inner cells, each of said plurality of inner cells on the first side of said inner cell array having a first pitch length;

an outer cell array, formed between the first through fourth sides of the semiconductor chip and said inner cell array, including a plurality of outer cells having patterns and each of said patterns having a second pitch length, wherein corresponding sets of said outer cells and said inner cells are arranged in a predetermined position a plurality of times between at least the first side of said inner cell array and the first side of the semiconductor chip, the second pitch length being related to the first pitch length by a ratio of two positive integers, the integer corresponding to the second pitch length being the number of patterns;

a power supply portion, formed on said outer cell array between the first through fourth sides of the semiconductor chip and said inner cell array, having one or more outer supply lines; and a plurality of inner power supply lines, formed on said inner cell array and operatively connected to said outer supply lines, disposed in a one-to-one correspondence with said inner cells.

* * * * *

UNITED STATES PATENT AND TRADEMARK OFFICE
CERTIFICATE OF CORRECTION

PATENT NO. : 4,523,106

DATED : JUNE 11, 1985

INVENTOR(S) : TETSU TANIZAWA ET AL.

It is certified that error appears in the above-identified patent and that said Letters Patent is hereby corrected as shown below:

FRONT PAGE, after [22] Filed: Aug. 25, 1982" insert the following:

--[30] Foreign Application Priority Data

Aug. 28, 1981 [JP] Japan ........... 56-135205--.

Signed and Sealed this

Eighth Day of October 1985

[SEAL]

Attest:

Attesting Officer

DONALD J. QUIGG

Commissioner of Patents and Trademarks—Designate